(12) United States Patent
Al-Momani et al.

(10) Patent No.: US 9,844,144 B1
(45) Date of Patent: Dec. 12, 2017

(54) POGO PIN INTEGRATED CIRCUIT PACKAGE MOUNT

(71) Applicant: Intel Corporation, Santa Clara, CA (US)

(72) Inventors: Emad Al-Momani, Austin, TX (US); Jack Mumbo, Beaverton, OR (US); Srikanth Mothukuri, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/231,018

(22) Filed: Aug. 8, 2016

(51) Int. Cl.
*H05K 1/18* (2006.01)

(52) U.S. Cl.
CPC ..... *H05K 1/181* (2013.01); *H05K 2201/1056* (2013.01); *H05K 2201/10318* (2013.01); *H05K 2201/10378* (2013.01); *H05K 2201/10393* (2013.01); *H05K 2201/10409* (2013.01); *H05K 2201/10598* (2013.01); *H05K 2201/10719* (2013.01); *H05K 2201/10734* (2013.01)

(58) Field of Classification Search
USPC ....................................... 361/764
See application file for complete search history.

(56) References Cited

U.S. PATENT DOCUMENTS

| 5,150,041 | A | 9/1992 | Eastin et al. |
| 5,311,119 | A | 5/1994 | Bullock et al. |
| 6,359,452 | B1 | 3/2002 | Mozzetta |
| 7,268,571 | B1 * | 9/2007 | Korson ................. G01R 35/02 324/750.01 |
| 7,352,197 | B1 * | 4/2008 | Mardi ................. G01R 1/0408 324/750.25 |
| 2007/0109000 | A1 | 5/2007 | Inoue et al. |
| 2014/0091827 | A1 | 4/2014 | Hung |

OTHER PUBLICATIONS

International Search Report and Written Opinion dated Oct. 18, 2017 for International Application No. PCT/US2017/041141, 13 pages.

* cited by examiner

*Primary Examiner* — Andargie M Aychillhum
(74) *Attorney, Agent, or Firm* — Schwabe, Williamson & Wyatt, P.C.

(57) ABSTRACT

Apparatuses, systems and methods associated with electrical fast transient tolerant input/output (I/O) communication (e.g., universal serial bus (USB)) design are disclosed herein. In embodiments, an apparatus to mount an integrated circuit (IC) package, may include a printed circuit board (PCB), a plurality of pogo pins, and a mounting mechanism. The plurality of pogo pins may be mounted to electrical contacts of the PCB, the plurality of pogo pins may be coupled to the electrical contacts at first ends of the plurality of pogo pins and may be to couple to the IC package at second ends of the plurality of pogo pins. The mounting mechanism may position the IC package on the second ends of the plurality of pogo pins. Other embodiments may be described and/or claimed.

20 Claims, 12 Drawing Sheets

US 9,844,144 B1

POGO PIN INTEGRATED CIRCUIT PACKAGE MOUNT

TECHNICAL FIELD

The present disclosure relates to the field of electronic circuits. More particularly, the present disclosure relates to integrated circuit package mount design for printed circuit boards.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As computer technology continues to advance, legacy integrated circuit (IC) package mounting sockets will likely be unable to support the speeds of future generations of IC packages. The speeds of legacy IC packages are currently approaching the maximum supportable by the legacy IC package mounting sockets and will soon surpass this threshold.

In order to address this issue, many computer products have transitioned to IC packages with a ball grid array (BGA). However, in many industries (including mobile devices) sockets for IC packages with a BGA meeting the application specifications are not available. Accordingly, rather than mount the IC packages with a BGA via sockets, the IC packages are soldered down to a printed circuit board (PCB). Repetitive soldering of the IC packages to the PCB may cause damage to the IC packages. Further, the soldered IC packages are difficult to debug and, if the soldered IC packages fail, the soldered IC packages are difficult to remove and replace.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
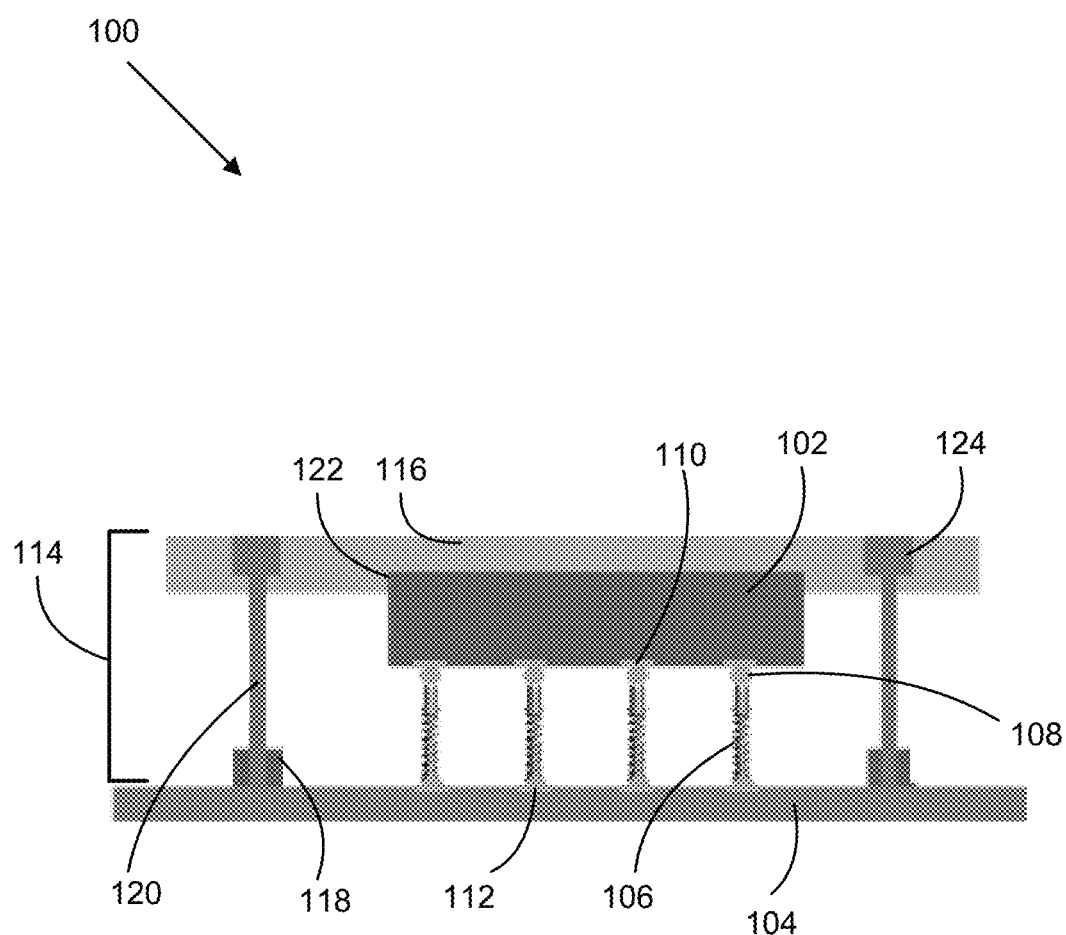
FIG. 1 illustrates an example pogo pin integrated circuit package mount via surface-mount technology, according to various embodiments.

Apparatuses, systems and methods associated with electrical fast transient tolerant input/output (I/O) communication (e.g., universal serial bus (USB)) design are disclosed herein. In embodiments, an apparatus to mount an integrated circuit (IC) package, may include a printed circuit board (PCB), a plurality of pogo pins, and a mounting mechanism. The plurality of pogo pins may be mounted to electrical contacts of the PCB, the plurality of pogo pins may be coupled to the electrical contacts at first ends of the plurality of pogo pins and may be to couple to the IC package at second ends of the plurality of pogo pins. The mounting mechanism may position the IC package on the second ends of the plurality of pogo pins.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example pogo pin integrated circuit (IC) package mount 100 via surface-mount technology, according to various embodiments. The pogo pin IC package mount 100 may mount an IC package 102 to a printed circuit board (PCB) 104. The IC package 102 may include a through-hole package (such as a single in-line package and a dual in-line package), a surface mount package (such as a column grid array package and a land grid array package), a chip carrier package (such as a bump chip carrier), a pin grid array package, a flat package (such as a dual flat package, a quad flat package, and a no-lead flat package), a small outline package, a chip scale package, and/or a ball grid array package. Further, the IC package 102 may include a computer processor unit, a system on chip, a memory device (such as a dynamic random-access memory, a flash memory, and a read-only memory), a controller, a communication chip, digital logic gates, multiplexers, flip flops, amplifiers (such as operational amplifiers and audio amplifiers), converters, comparators, timers, transistors, and/or switches.

The IC package mount 100 may include a plurality of pogo pins 106. The plurality of pogo pins 106 may be mounted to a side of the PCB 104. Each of the plurality of pogo pins 106 may be soldered on a first end to a corresponding electrical contact of the PCB 104 and may be electrically coupled to the corresponding electrical contact. Each of the plurality of pogo pins 106 may be separated from the other pogo pins of the plurality of pogo pins 106 by air. The air, having a low dielectric constant, may provide insulating qualities. The separation by air may prevent and/or limit cross talk between the pogo pins within the plurality of pogo pins 106. In some embodiments, the pogo pins may be separated by other materials with low dielectric constants.

A second end of each of the plurality of pogo pins 106 may be electrically coupled to a corresponding electrical contact of the IC package 102. The second end of each of the plurality of pogo pins 106 may physically contact the corresponding electrical contact and contact between the second end and the corresponding electrical contact may be maintained by a compression force applied to one or both of the PCB 104 and the IC package 102 that urges the PCB 104 and the IC package 102 together. The plurality of pogo pins 106 may electrically couple the electrical contacts 110 of the IC package 102 with the electrical contacts 112 of the PCB 104. Accordingly, the IC package 102 may be electrically coupled to the PCB 104 via the plurality of pogo pins 106 without soldering of the IC package 102, which allows for easy interchange of the IC package 102 without soldering and de-soldering.

In some embodiments, the second ends of the plurality of pogo pins 106 may be coated with a non-corrosive material. The non-corrosive material may include a non-gold, electrically conductive material, such as C3 coating, tin, nickel, silver, palladium, tin alloy, nickel alloy, silver alloy, palladium alloy, or some combination thereof. Coating the second ends of the plurality of pogo pins 106 with the non-corrosive material may prevent intermetallic formation that may form between the second ends of the plurality of pogo pins 106 and the IC package 102 and affix the IC package 102 to the second ends of the plurality of pogo pins 106.

In some embodiments, the IC package 102 may include a ball grid array (BGA) 108 affixed to the electrical contacts 110 of the IC package 102. In these embodiments, the solder balls of the BGA 108 may physically contact the second ends of the plurality of pogo pins 106 when the IC package 102 is positioned on the plurality of pogo pins 106. The BGA 108 may remain in solidified form without being soldered to the plurality of pogo pins 106 while providing electrical coupling between the electrical contacts 110 of the IC package 102 and the plurality of pogo pins 106.

The IC package mount 100 may further include a mounting mechanism 114. The mounting mechanism 114 may position the IC package 102 on the plurality of pogo pins 106 and may maintain the position of the IC package 102 relative to the pogo pins 106 and the PCB 104. The mounting mechanism 114 may apply the compression force to one or both of the PCB 104 and the IC package 102 that may maintain the electrical contact between the electrical contacts 110 of the IC package 102 and the second ends of the plurality of pogo pins 106. The compression force applied by the mounting mechanism 114 may further cause the plurality of pogo pins 106 to be compressed that may electrically couple the first ends of the plurality of pogo pins 106 to the second ends of the plurality of pogo pins 106.

The mounting mechanism 114 may include a mounting plate 116, one or more surface mount (SMT) fixtures 118, and one or more mounting extensions 120. The mounting plate 116 may be positioned on a side of the IC package 102 opposite from the plurality of pogo pins 106 and the PCB 104. The mounting plate 116 may include a cavity 122 and the IC package 102 may be positioned, at least partially, within the cavity 122. The mounting plate 116, via the IC package 102 being positioned, at least partially, within the cavity 122, may maintain a position of the IC package 102 relative to a length of the mounting plate 116. In other embodiments, the mounting plate 116 may not include the cavity 122, but may include a different means of maintaining a position of the IC package 102 relative to the length of the mounting plate 116, such as the mounting plate 116 may include an adhesive to temporarily affix the IC package 102 to the side of the mounting plate 116, extrusions to position the IC package 102, or some combination thereof.

The one or more SMT fixtures 118 may be mounted to the PCB 104. The SMT fixtures 118 may be mounted to the PCB 104 by an epoxy, an adhesive, soldering the SMT fixtures 118 to a metallic feature on a surface of the PCB 104, or some combination thereof. Each of the SMT fixtures 118 may include a threaded aperture, formed within each of the SMT fixtures 118, wherein the threaded aperture extends perpendicularly to the PCB 104.

The mounting extensions 120 may affix the mounting plate 116 to the SMT fixtures 118 and may maintain a relative position between the mounting plate 116 and the PCB 104. The relative position may be based on a length of the plurality of pogo pins 106, the thickness of the IC package, diameters of the solder balls in the BGA 108, or some combination thereof. The mounting extensions 120 may extend through apertures 124 formed in the mounting plate 116 and into the SMT fixtures 118.

As the mounting extensions 120 are inserted into the SMT fixtures 118, the mounting plate 116 may align the IC package 102 with the plurality of pogo pins 106. The mounting plate 116 may align the electrical contacts 110 of the IC package 102 with the second ends of the plurality of pogo pins 106. As the mounting extensions 120 are inserted into the SMT fixtures 118, the IC package 102 may move toward the PCB 104 in a direction perpendicular to the surface to the surface of the PCB 104 to which the plurality of pogo pins 106 are mounted and may, therefore, minimize any force that may be applied to the plurality of pogo pins 106 that is not in the direction of compression of the plurality of pogo pins 106, which may cause damage to the plurality of pogo pins 106.

Further, as the mounting extensions 120 are inserted into the SMT fixtures 118, the mounting extensions 120 may generate a compression force between the mounting plate 116 and the PCB 104 urging the mounting plate 116 and the PCT 104 toward each other. The compression force may be equal or greater than a determined amount of compression force to cause the plurality of pogo pins 106 to be compressed. An amount of the compression force may be determined based on a number of pogo pins in the plurality of pogo pins 806, a type of the plurality of pogo pins 806, or some combination thereof. The amount of the compression force may be equal to a number of pogo pins in the plurality of pogo pins 806 multiplied by a compression force of a single pogo pin in the range of 0.4 newtons to 2 newtons. The compression force may be translated from the mounting plate 116 to the IC package 102 and may provide the compression force between the IC package 102 and the PCB 104. The compression force between the IC package 102 and the PCB 104 may cause the plurality of pogo pins 106 to compress, electrically coupling the first ends of the plurality of pogo pins 106 to the second ends of the plurality of pogo pins 106.

The mounting extensions 120 may include one or more screws, wherein the screws may be installed into the threaded apertures of the SMT fixtures 118 and the heads of the screws may contact the mounting plate 116 and may maintain the position of the mounting plate 116. The length of the mounting extensions 120 may be based on the length of the plurality of pogo pins 106, the distance of available compression between the first ends and the second ends of the plurality of pogo pins 106, a thickness of the IC package 102, a thickness of the mounting plate 116, or some combination thereof. In some embodiments, the mounting extensions 120 may be a part of the mounting plate 116 and may extend into the SMT fixtures 118. Further, in some embodiments, the mounting extensions 120 may be unthreaded and may be held within the SMT fixtures 118 by another means of affixture, such as frictional force, a clamping mechanism, or some combination thereof.

Figure 2:
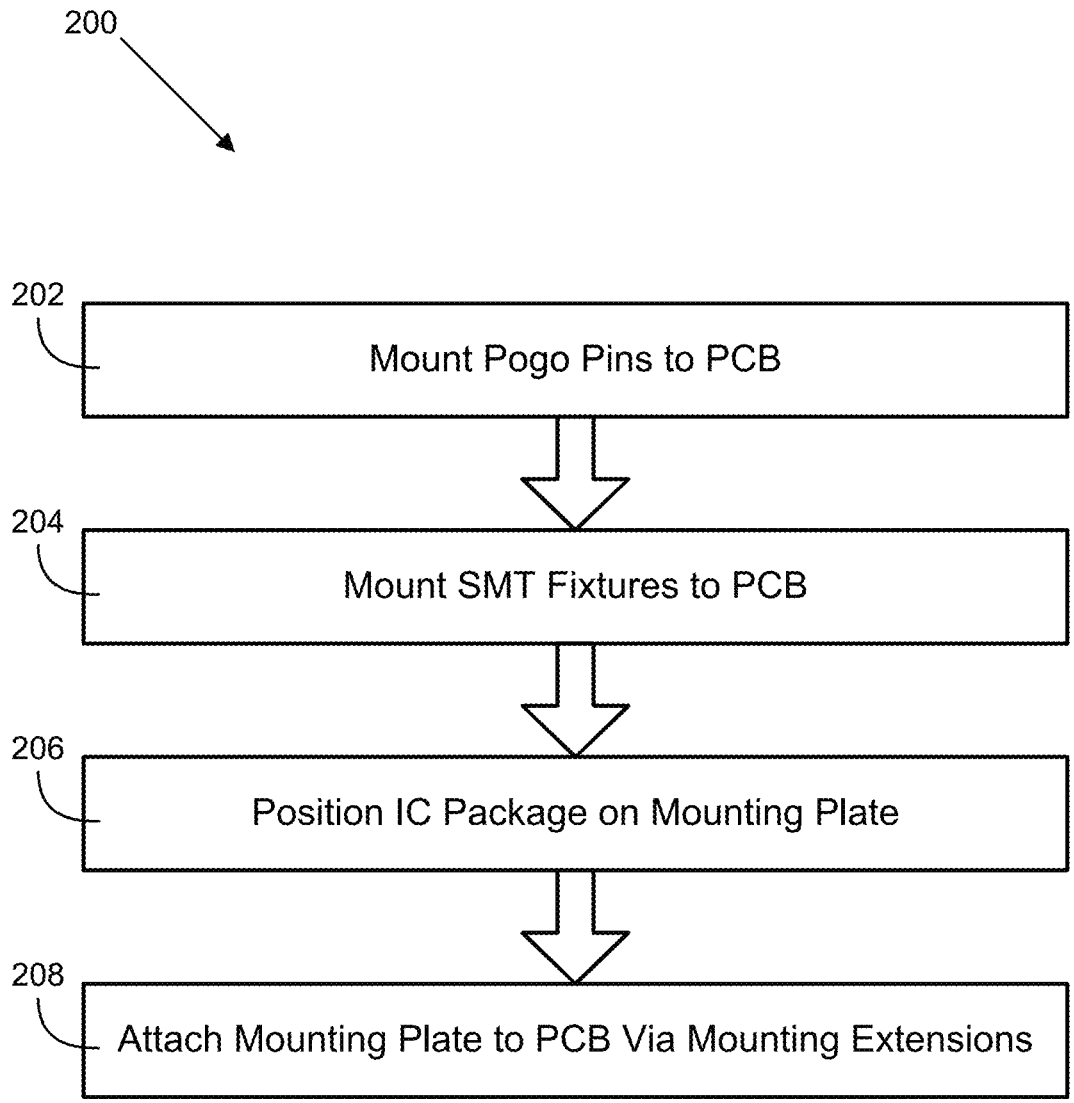
FIG. 2 illustrates an example process of generating the pogo pin integrated circuit package mount of FIG. 1, according to various embodiments.
Figure 3:
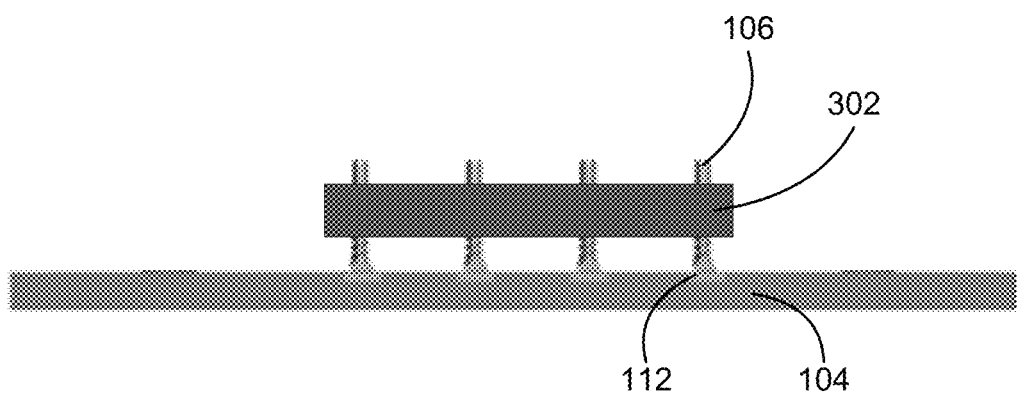
FIG. 3 illustrates example pogo pin mounting, according to various embodiments.

FIG. 2 illustrates an example process of generating the pogo pin integrated circuit package mount 100 of FIG. 1, according to various embodiments. In 202, the plurality of pogo pins 106 are mounted to the PCB 104, as is illustrated in FIG. 3. The plurality of pogo pins 106 may be positioned within a carrier body 106 during the mounting process. The carrier body 302 may be used for aligning the plurality of pogo pins 106 with the electrical contacts 112 of the PCB 104 and may maintain the positions of the plurality of pogo pins 106 during the mounting process. Once aligned, first sides of the plurality of pogo pins 106 may be soldered to the electrical contacts 112 of the PCB 104. After the plurality of pogo pins 106 are soldered to the electrical contacts 112, the carrier body 302 may be removed from the plurality of pogo pins 106.

Figure 4:
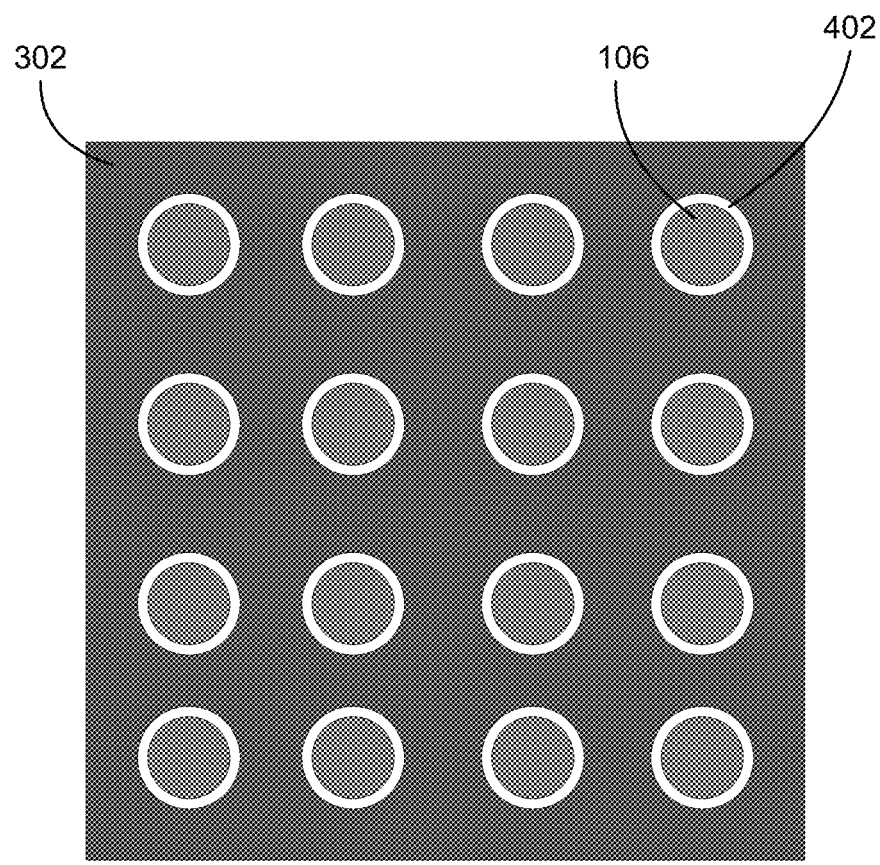
FIG. 4 illustrates an example carrier body that may be utilized for pogo pin mounting, according to various embodiments.

FIG. 4 illustrates an example carrier body 302 that may be utilized for pogo pin mounting in 202, according to various embodiments. The carrier body 302 may include a plurality of apertures 402. The plurality of apertures 402 may correspond to a layout of the electrical contacts 112 of the PCB 104 (FIG. 3) with one aperture corresponding to each of the electrical contacts 112, such that when the carrier body 302 is aligned with the PCB 104 (FIG. 3) each of the apertures of the plurality of apertures 402 is aligned with a corresponding electrical contact of the electrical contacts 112.

The plurality of pogo pins 106 may be positioned within the plurality of apertures 402. The plurality of pogo pins 106 may be maintained in the plurality of apertures 302 by frictional force between the plurality of pogo pins 106 and the carrier body 302, an adhesive applied to the walls of the plurality of apertures 402, or some combination thereof. The plurality of pogo pins 106 may be removed from the plurality of apertures 302 via application of a removal force applied to the plurality of pogo pins 106 and/or the carrier body 302 that is large enough to overcome the frictional force and/or the retaining force generated by the adhesive. The carrier body 302 may be designed such that the frictional force and/or the retaining force generated by the adhesive is less than an affixation force of solder, such that plurality of pogo pins 106 may be removed from the carrier body 302 when the plurality of pogo pins 106 are soldered to the PCB 104 via application of the removal force without any of the pogo pins 106 being separated from the PCB 104.

In some embodiments, the plurality of pogo pins 106 may be individually soldered to the PCB without the use of the carrier body 302. Each of the individual pogo pins may be aligned with a corresponding electrical contact of the PCB 104 and soldered to the corresponding electrical contact. Further, in some embodiments, the plurality of pogo pins 106 may be packaged on a tape and reel and may be soldered to the PCB 104 by a machine, such as an automatic pick and place machine.

Figure 5:
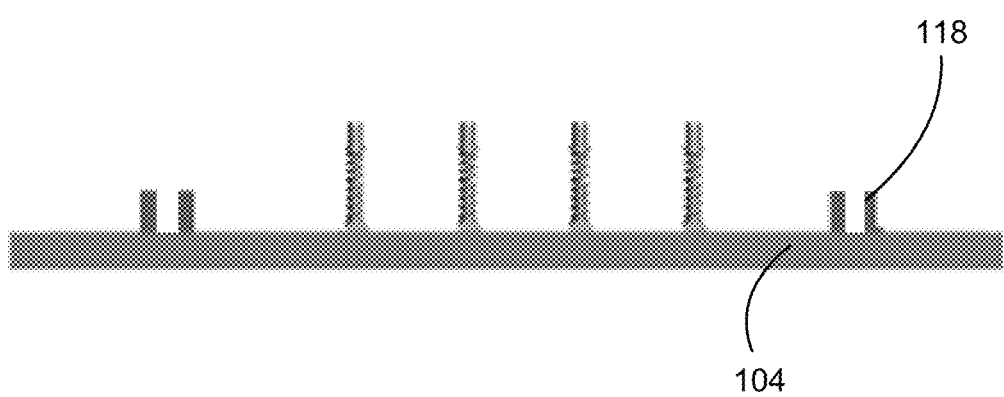
FIG. 5 illustrates example surface mount fixture mounting, according to various embodiments.

In 204, the one or more SMT fixtures 118 may be mounted to the PCB 104, as illustrated in FIG. 5. The SMT fixtures 118 may be mounted to the PCB 104 by aligning each of the SMT fixtures 118 with a corresponding metallic feature on the surface of the PCB 104 and soldering each of the SMT fixtures 118 on the corresponding metallic feature. In some embodiments, an epoxy may be applied to the SMT fixtures 118, the SMT fixtures 118 may be positioned on the surface of the PCB 104, and the epoxy may be cured to affix the SMT fixtures 118 to the PCB 104. The epoxy may be cured by the application of heat, light, chemicals, or some combination thereof, to the epoxy. Further, in some embodiments the SMT fixtures 118 may be affixed to the PCB 104 by an adhesive, such as double sided tape.

The SMT fixtures 118 may be positioned on the PCB 104 to correspond with a desired position of the mounting plate 116 for aligning the IC package 102 with the plurality of pogo pins 106. The SMT fixtures 118 may be mounted to the PCB 104 such that the SMT fixtures 118 align with the apertures 124 formed in the mounting plate 116 when the IC package 102 is aligned with the plurality of pogo pins 106.

Figure 6:
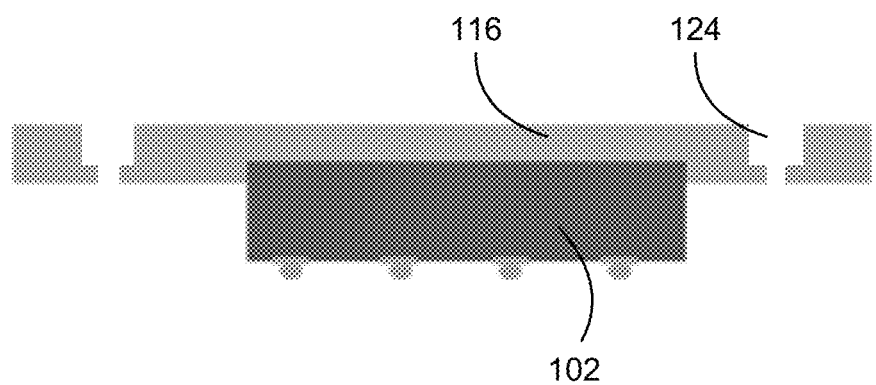
FIG. 6 illustrates example integrated circuit package placement within the mounting plate, according to various embodiments.

In 206, the IC package 102 may be positioned on the mounting plate 116, as illustrated in FIG. 6. The IC package 102 may be positioned, at least partially, within the cavity 122 of the mounting plate 116. A side of the IC package 102 opposite the electrical contacts 110 may be orientated toward the mounting plate 116 and may abut the mounting plate 116 when positioned, at least partially, within the cavity 122.

In some embodiments, the mounting plate 116 may not include the cavity 122. In these embodiments, the IC package 102 may be aligned with markings on the mounting plate 116 and may be positioned on the mounting plate using an adhesive. Further, in some embodiments, the mounting plate 116 may include extrusions. In these embodiments, the IC package 102 may be aligned between the extrusions of the mounting plate 116.

Figure 7:
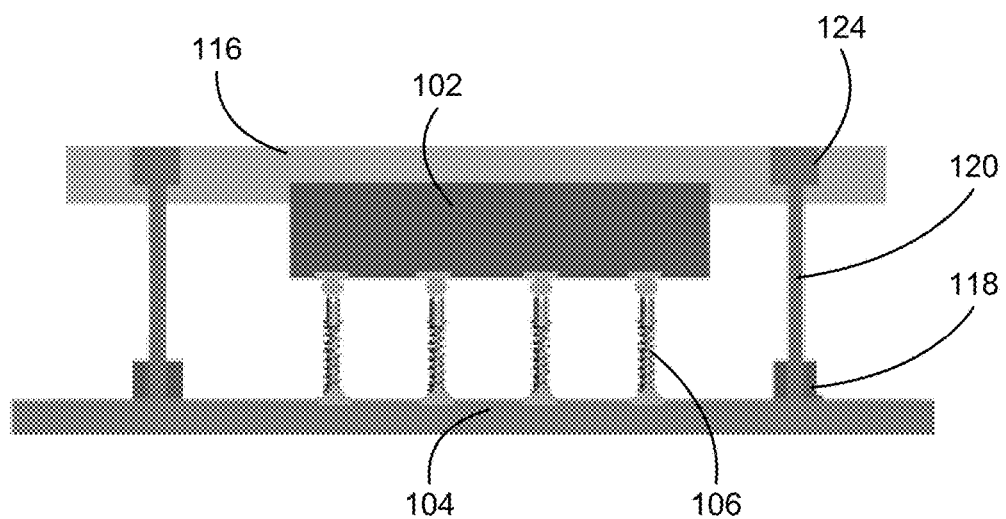
FIG. 7 illustrates example integrated circuit package mounting to a printed circuit board, according to various embodiments.

In 208, the mounting plate 116 may be attached to the PCB 104 via the one or more mounting extensions 120, as illustrated in FIG. 7. The mounting plate 116 may be aligned with the PCB 104, wherein the mounting plate 116 may position the IC package 102 positioned on the second end of the plurality of pogo pins 106 when aligned with the PCB 104. The mounting extensions 120 may extend through the apertures 124 of the mounting plate 116 and into the SMT fixtures 118 mounted to the PCB 104. As the mounting extensions 120 are inserted into the SMT fixtures 118, a compression force may be generated, by the mounting plate 116, between the IC package 102 and the PCB 104, urging the IC package 102 and the PCB 104 toward each other. The mounting extensions 120 may become affixed to the SMT fixtures 118 and may maintain a position of the mounting plate 116 relative to the PCB 104. The compression force, when the mounting extensions 120 are affixed to the SMT fixtures 118, may be equal to or greater than a compression force for maintaining the plurality of pogo pins 106 in a compressed state.

Figure 8:
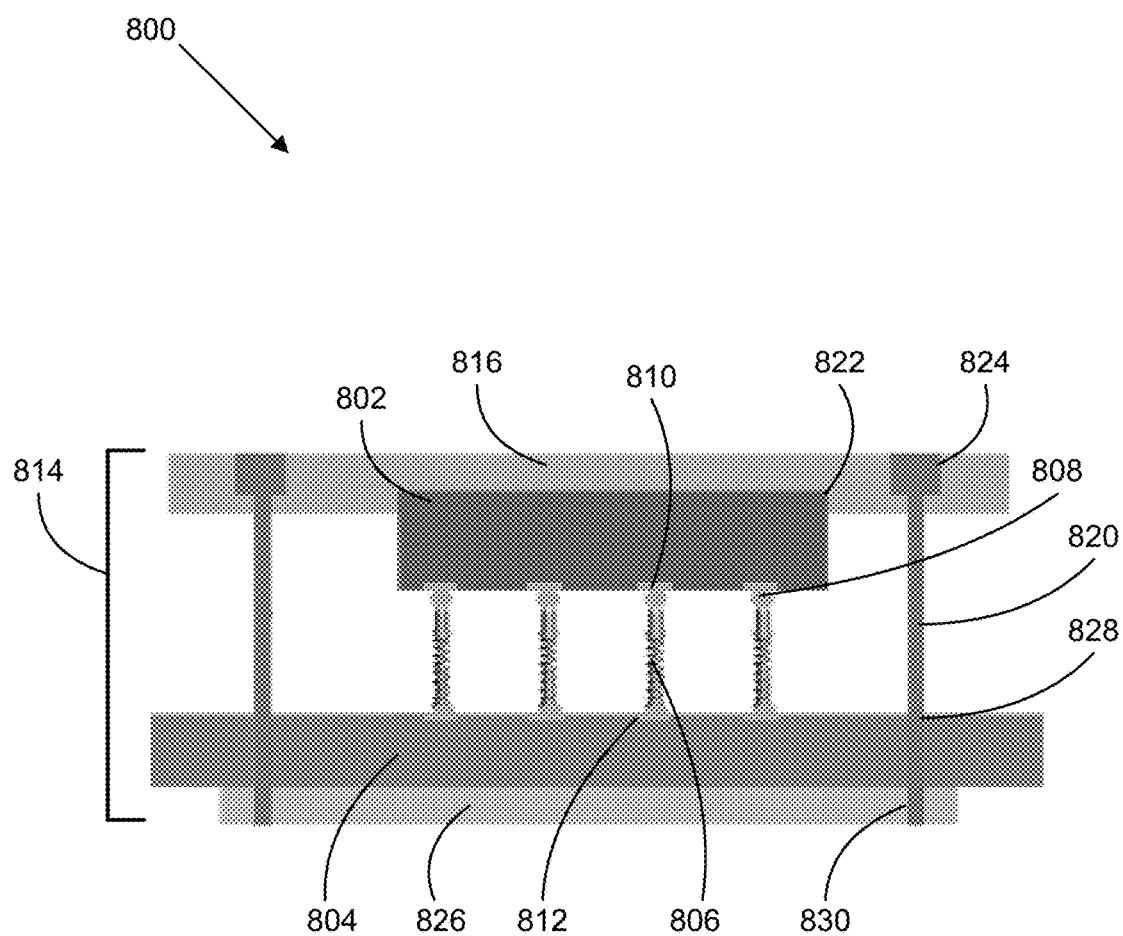
FIG. 8 illustrates an example pogo pin integrated circuit package mount utilizing a through aperture design, according to various embodiments.

FIG. 8 illustrates an example pogo pin IC package mount 800 utilizing a through aperture design, according to various embodiments. The pogo pin IC package mount 800 may include one or more of the features of the pogo pin IC package mount 100 (FIG. 1), including the features of the plurality of pogo pins 106, the mounting plate 116, the mounting extensions 120, or some combination thereof. The IC package mount 800 may mount an IC package 802 to a PCB 804. The IC package 802 may include one or more of the features of the IC package 102 (FIG. 1) and the PCB 804 may include one or more of the features of the PCB 104 (FIG. 1).

The IC package mount 800 may include a plurality of pogo pins 806 mounted at first ends of the plurality of pogo pins 806 to electrical contacts 812 of the PCB 804. The plurality of pogo pins 806 may include one or more of the features of the plurality of pogo pins 106. Further, the plurality of pogo pins 806 may be mounted to the PCB 804 by one or more of the processes and/or means for mounting of the plurality of pogo pins 106 to the electrical contacts 112 (FIG. 1), including soldering the first ends of the plurality of pogo pins 806 to the electrical contacts 812. Accordingly, the first ends of the plurality of pogo pins 806 may be electrically coupled to the electrical contacts 812 of the PCB 804.

The pogo pin IC package mount 800 may include a mounting mechanism 814 for mounting the IC package 802 on a second end of the plurality of pogo pins 806. The mounting mechanism may include one or more of the features of the mounting mechanism 114 (FIG. 1).

The mounting mechanism 814 may include a mounting plate 816. The mounting plate 816 may include one or more of the features of the mounting plate 116 (FIG. 1). The mounting plate 816 may include a cavity 822 formed in one of the sides of the mounting plate 816. The IC package 802 may be positioned, at least partially, within the cavity 822. The cavity 822 may be utilized for maintaining the IC package 802 in a position in relative to the mounting plate 816 and may be utilized for alignment of the IC package 802 with the plurality of pogo pins 806. Further, the mounting plate 816 may align electrical contacts 810 of the IC package 802 with second ends of the plurality of pogo pins 806.

In some embodiments, the mounting plate 816 may not include the cavity 822. In these embodiments, an adhesive and/or epoxy may be applied to the side of the mounting plate 816 to maintain the IC package 802 in a position relative to the mounting plate 816 when the IC package 802 is positioned on the side of the mounting plate 816. In these embodiments, markings formed on, and/or applied to, the mounting plate 816 may be utilized for positioning the IC package 802 on the side of the mounting plate 816. Further, in some embodiments, the mounting plate 816 may include extrusions for aligning the IC package 802 on the mounting plate 816. The IC package 802 may be positioned between the extrusions.

The mounting mechanism 814 may include a back plate 826. The back plate 826 may be positioned on an opposite side of the PCB 804 from the mounting plate 816 and the IC package 802. The back plate 826 may contact a side of the PCB 804 opposite from the plurality of pogo pins 806 when the IC package 802 is positioned on the plurality of pogo pins 806.

The mounting mechanism 814 may include one or more mounting extensions 820. The mounting extensions 820 may include one or more of the features of the mounting extensions 120 (FIG. 1). The mounting extensions 820 may affix the mounting plate 816 to the back plate 826. The mounting extensions 820 may extend through apertures 824 formed in the mounting plate 816 and apertures 828 formed in the PCB 804 into apertures 830 formed in the back plate 826. The apertures 830 formed in the back plate 826 may couple to the mounting extensions 820, affixing the mounting plate 816 to the back plate 826 via the mounting extensions 820. A length of the mounting extensions 802 may be based on a length of the plurality of pogo pins 806, the distance of available compression between the first ends and the second ends of the plurality of pogo pins 106, a thickness of the IC package 802, a thickness of the PCB 804, a thickness of the mounting plate 806, a thickness of the back plate 826, or some combination thereof.

The mounting extensions 820 may include one or more screws. Heads of the screws may engage with the mounting plate 816 preventing movement of the mounting plate 816 in a direction opposite from the back plate 826. The apertures 830 of the back plate 826 may be threaded and may receive threads of the one or more screws, affixing the screws within the apertures 830. Further, in some embodiments, the mounting extensions 120 may be unthreaded and may be held within the SMT fixtures 118 by another means of affixture, such as frictional force, a clamping mechanism, or some combination thereof.

When affixed by the mounting extensions 820, the mounting plate 816 may position the IC package 802 on the second ends of the plurality of pogo pins 806 with the electrical contacts 810 of the IC package 802 aligned with the second ends of the plurality of pogo pins 806. The electrical contacts 810 of the IC package 802 may contact the second ends of the plurality of pogo pins 806, electrically coupling the electrical contacts 810 with the second ends of the plurality of pogo pins 806. Accordingly, the electrical contacts 810 of the IC package 802 may be electrically coupled to the second ends of the plurality of pogo pins 806 without the electrical contacts 810 being soldered, or otherwise permanently or semi-permanently affixed, to the plurality of pogo pins 806. In some embodiments, the IC package 802 may include a BGA 808 formed on the electrical contacts 810 of the IC package 802 and the solder balls of the BGA 808 may contact the second ends of the plurality of pogo pins 806, electrically coupling the electrical contacts 810 with the second ends of the plurality of pogo pins 806.

Further, when affixed by the mounting extension 820, a compression force may be generated urging the mounting plate 816 and the back plate 826 toward each other. The compression force may be a force equal to or greater than a compression force to compress the plurality of pogo pins 806. An amount of the compression force may be determined based on a number of pogo pins in the plurality of pogo pins 806, a type of the plurality of pogo pins 806, or some combination thereof. This compression force may be transferred to the IC package 802 by the mounting plate 816 and to the PCB 804 by the back plate 826 and the compression force may urge the IC package 802 and the PCB 804 toward each other.

The compression force may cause the plurality of pogo pins 806, located between the IC package 802 and the PCB 804, to be compressed, which may cause the first ends of the plurality of pogo pins 806 to be electrically coupled to the second ends of the plurality of pogo pins 806. Accordingly, the electrical contacts 810 of the IC package 802 may be electrically coupled to the electrical contacts 812 of the PCB 804 via the plurality of pogo pins 806, allowing transmission of electrical signals between the electrical contacts 810 of the IC package 802 and the electrical contacts 812 of the PCB 804.

Figure 9:
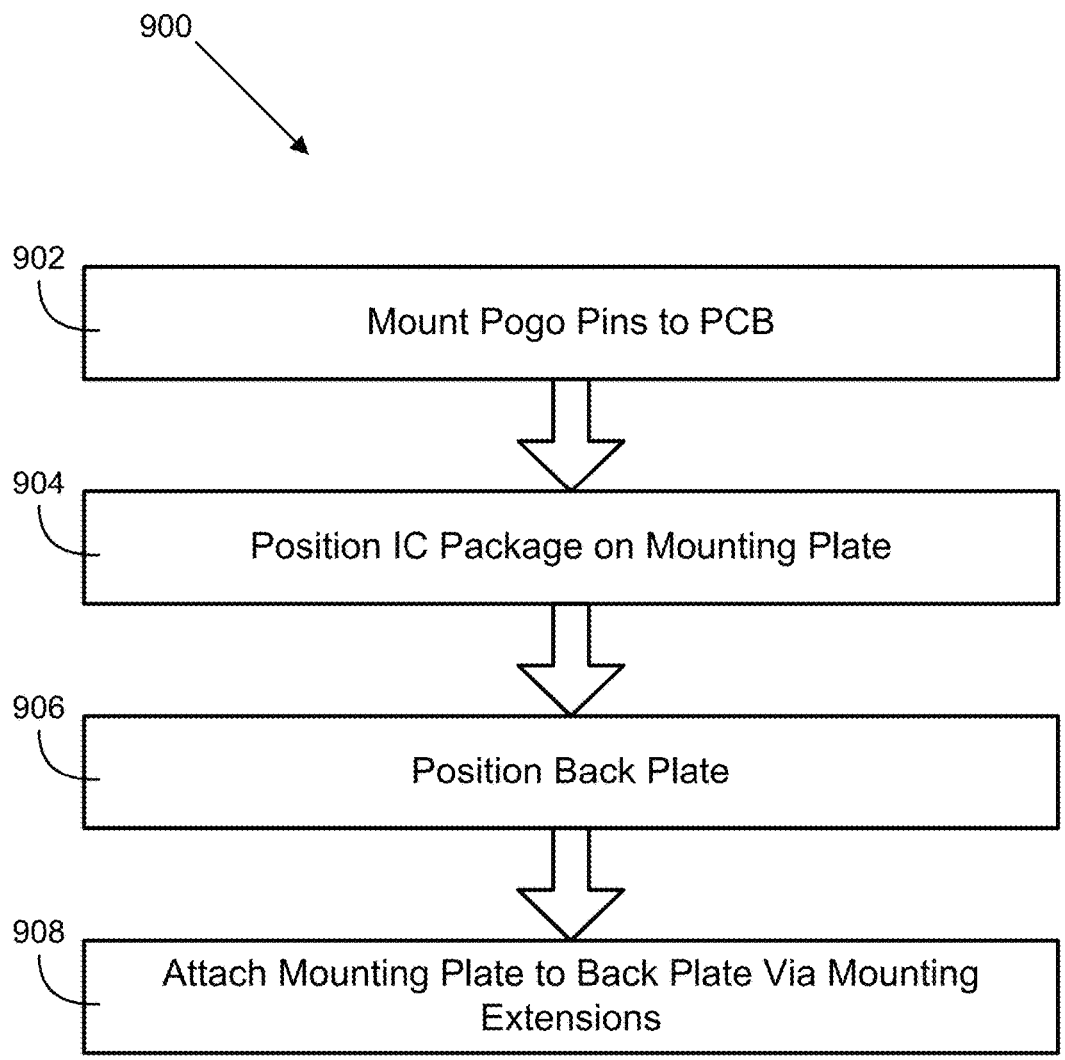
FIG. 9 illustrates an example process of generating the pogo pin integrated circuit package mount of FIG. 8, according to various embodiments.

FIG. 9 illustrates an example process 900 of generating the pogo pin integrated circuit package mount 800 of FIG. 8, according to various embodiments. In 902, the plurality of pogo pins 806 may be mounted to the PCB 804. The process of mounting the plurality of pogo pins 806 to the PCB 804 may include one or more of the features of 202 (FIG. 2), including soldering the plurality of pogo pins 806 to the electrical contacts of 812 of the PCB 804, positioning the plurality of pogo pins 806 on the electrical contacts of 812 of the PCB 804 using a carrier body (such as carrier body 302 (FIG. 3)), or some combination thereof.

In 904, the IC package 802 may be positioned on the mounting plate 816. The positioning of the IC package 802 on the mounting plate 816 may include one or more of the features of 206 (FIG. 2) related to the positioning of the IC package 102 on the mounting plate 116. The IC package 802 may be positioned, at least partially, within the cavity 822 of the mounting plate 816, with the electrical contacts 810 of the IC package 802 orientated in a direction opposite to the mounting plate 816.

In 906, the back plate 826 is positioned on the PCB 804. The back plate 826 is positioned on a side of the PCB 804 opposite to the plurality of pogo pins 806. The back plate 826 may be positioned with the apertures 830 of the back plate 826 aligned with the apertures 828 of the PCB 804.

In 908, the mounting plate 816 may be attached to the back plate 826 via the one or more mounting extensions 820. The mounting extensions 820 may be routed through the apertures 824 formed in the mounting plate 816, through the apertures 828 formed in the PCB 804, and into the apertures 830 formed in the back plate 826. The apertures 830 of the back plate may couple to the mounting extensions 820 and attach the mounting plate 816 to the back plate 826 via the mounting extensions 820. The IC package 802 may be positioned on the second ends of the plurality of pogo pins 806 and the plurality of pogo pins 806 may be in a compressed state when the mounting plate 816 is attached to the back plate 826.

Figure 10:
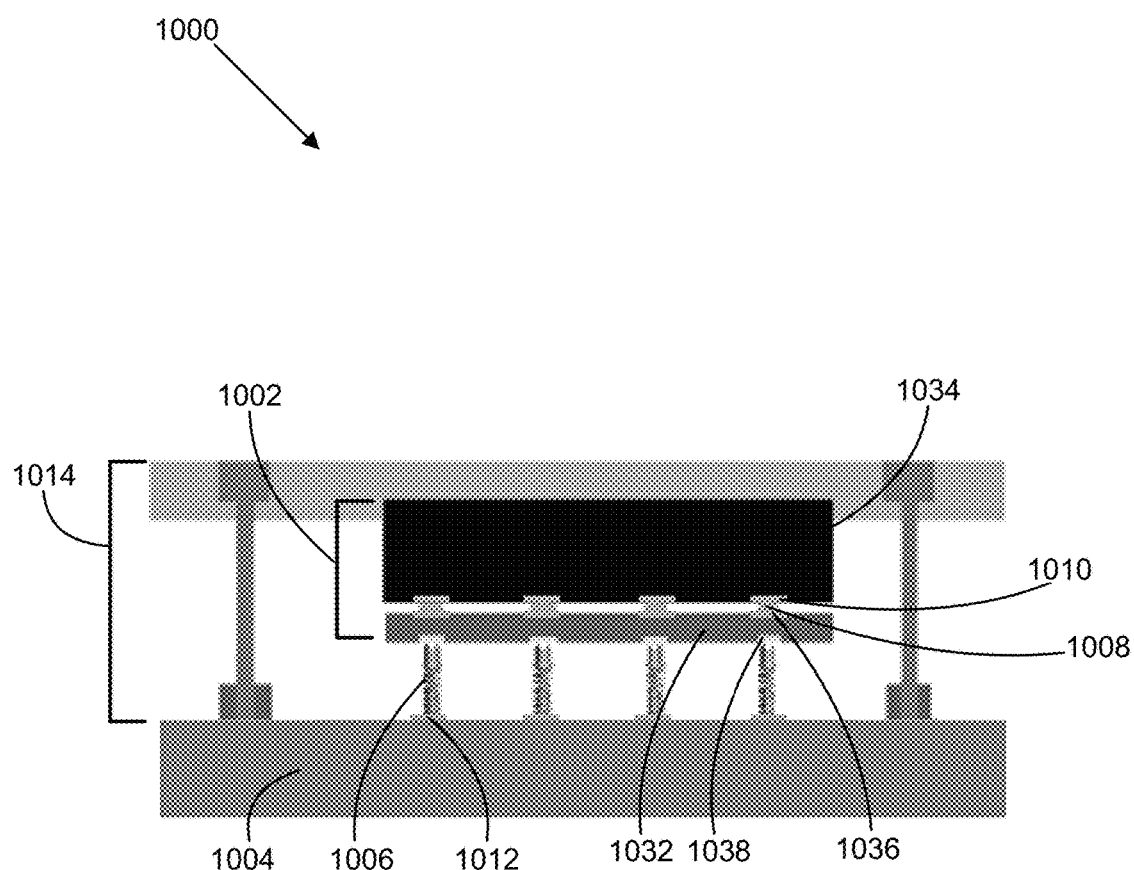
FIG. 10 illustrates an example pogo pin integrated circuit package mount with land grid array interposer, according to various embodiments.

FIG. 10 illustrates an example pogo pin IC package mount 1000 with land grid array (LGA) interposer 1032, according to various embodiments. The pogo pin IC package mount 1000 may mount an IC package 1002 to a PCB 1004. The PCB 1004 may include one or more of the features of the PCB 104 (FIG. 1) and/or the PCB 804 (FIG. 8), including the electrical contacts 112 of the PCB 104, the electrical contacts 812 of the PCB 804, the apertures 828 of the PCB 804, or some combination thereof.

The IC package mount 1000 may include a plurality of pogo pins 1006. The plurality of pogo pins 1006 may include one or more of the features of the plurality of pogo pins 106 (FIG. 1) and/or the plurality of pogo pins 806 (FIG. 8). Further, the plurality of pogo pins 1006 may be mounted to the PCB 1004 by a same process as 202 (FIG. 2) and/or 902 (FIG. 9) for mounting the plurality of pogo pins 106 and/or the plurality of pogo pins 806, respectively.

The IC package mount 1000 may include a mounting mechanism 1014. The mounting mechanism 1014 may include one or more of the features of the mounting mechanism 114 (FIG. 1), including the mounting plate 116, the SMT fixtures 118, the mounting extensions 120, or some combination thereof. The mounting mechanism 1014 may operate similarly to the mounting mechanism 114, including mounting the IC package 1002 to the plurality of pogo pins 1006, generating the compression force urging the IC package 1002 and the PCB 1004 towards each other, or some combination thereof.

The IC package 1002 may include a semiconductor package 1034 and an LGA interposer 1032. The semiconductor package 1034 may include a BGA 1008 formed on electrical contacts 1010 of the semiconductor package 1034. Solder balls of the BGA 1008 may be soldered to electrical contacts 1036 on a first side of the LGA interposer 1032, electrically coupling the electrical contacts 1010 of the semiconductor package 1034 to the electrical contacts 1036 on the first side of the LGA interposer 1032.

The LGA interposer 1032 may include an LGA 138 formed on a second side of the LGA interposer 1032. The second side of the LGA interposer 1032 may oppose the first side of the LGA interposer 1032. The LGA interposer 1032 may electrically couple the electrical contacts 1036 on the first side of the LGA interposer 1032 to the LGA 138 on the second side of the LGA interposer 1032. Accordingly, the electrical contacts 1010 of the semiconductor package 1034 are electrically coupled to the LGA 1038 of the LGA interposer 1032, allowing electrical signals to be transmitted between the electrical contacts 1010 and the LGA 1038.

The LGA 1038 of the LGA interposer 1032 may be aligned with the plurality of pogo pins 1060 and may contact the plurality of pogo pins 1060 when the IC package 1002 is mounted to the plurality of pogo pins 1060 by the mounting mechanism 1014. The plurality of pogo pins 1006 may be compressed by a compression force urging the IC package 1002 and the PCB 1004 toward each other, wherein the compression force may be generated by the mounting mechanism 1014.

The compressed plurality of pogo pins 1006 may electrically couple first ends of the plurality of pogo pins 1006, electrically coupled to electrical contacts 1012 of the PCB 1004, to second ends of the plurality of pogo pins 1006, electrically coupled to the LGA 1038 of the LGA interposer 1032. Accordingly, the IC package 1002 is electrically coupled to the PCB 1004, allowing transmission of electrical signals between the IC package 1002 and the PCB 1004.

Figure 11:
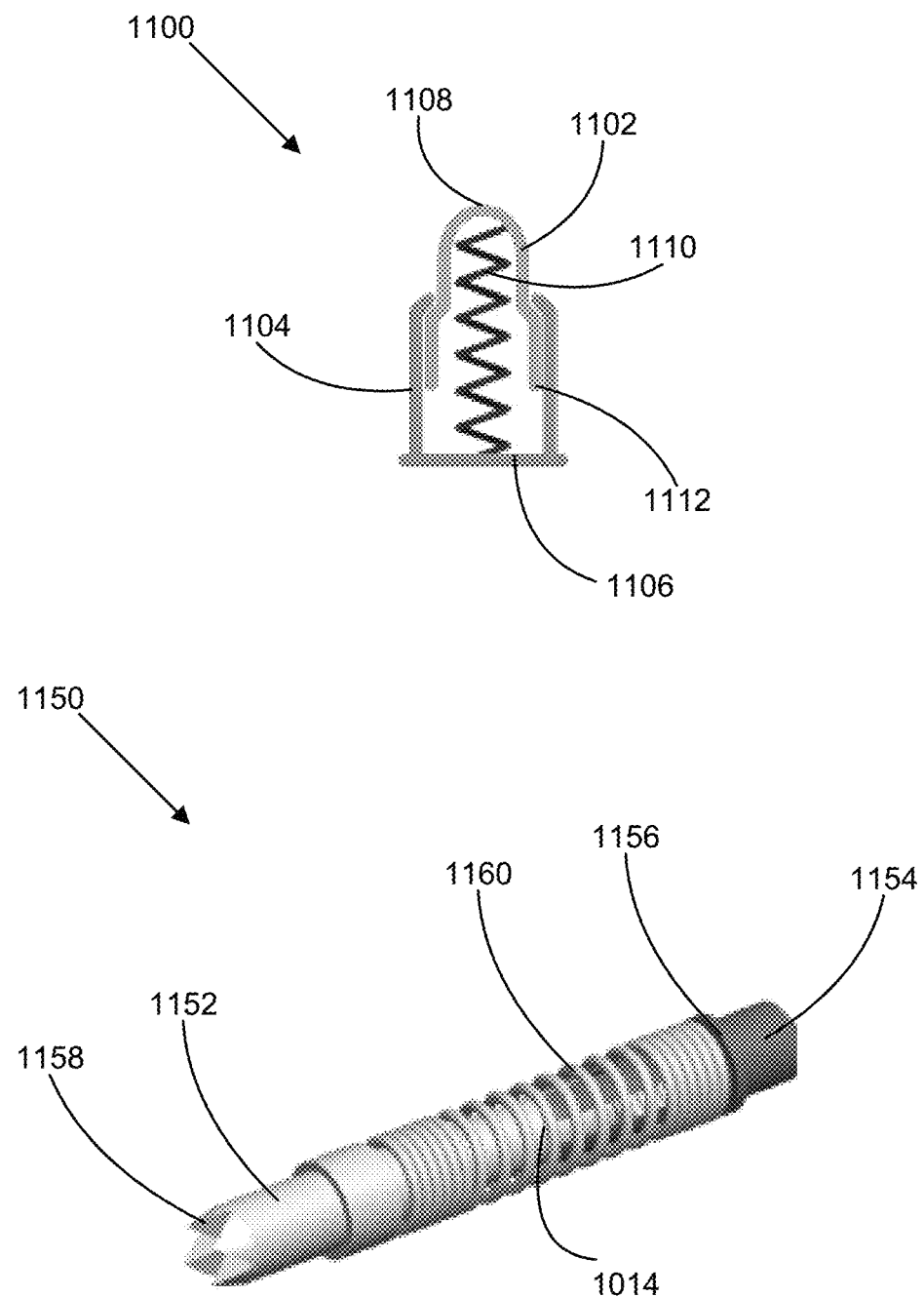
FIG. 11 illustrates example pogo pins that may be implemented in the pogo pin integrated circuit package mounts described herein, according to various embodiments.

FIG. 11 illustrates example pogo pins that may be implemented in the pogo pin IC package mounts described herein, according to various embodiments. A first embodiment of a pogo pin 1100 may include a plunger 1002 and a body 1104. In accordance with the embodiments of the pogo pin IC package mounts described here, a base 1106 of the body 1104 may be referred to as a first end of the pogo pin 1100 and a tip 1108 of the plunger 1102 may be referred to as a second end of the pogo pin 1100. In some embodiments, the tip 1108 may be coated with a non-corrosive material, such as non-gold, electrically conductive material including, but not limited to, a C3 coating.

A spring 1110 may be located within the pogo pin 1100. The spring 1110 may be positioned between the body 1104 and the plunger 1102, and may urge the plunger 1102 away from a base 1106 of the body 1104. When the spring 1110 is in an extended state, an end 1112 of the plunger 1102 may be separated from the base 1106 of the body 1104. This state may also be referred to as a non-compressed state of the pogo pin 1100. In the non-compressed state, the plunger 1102 may be electrically isolated from the body 1104 and, accordingly, electrical signals may be prevented from transmission between the tip 1108 of the plunger 1102 and the base 1106 of the body 1104.

As a compression force is applied to the tip 1108 of the plunger 1102 and/or the base 1106 of the body 1104 urging the tip 1108 toward the base 1106, the spring 1110 may be compressed and may allow the end 1112 of the plunger 1102 to contact the base 1106. The compression force to compress the spring may be equal to or greater than a resistance force of the spring 1110 to compression. When the spring 1110 is compressed, the pogo pin 1100 may be referred to as being in a compressed state. In the compressed state, the tip 1108 of the plunger 1102 may be electrically coupled to the base 1106 of the body 1104 and may allow transmission of electrical signals between the base 1106 (i.e. the first end of the pogo pin 1100) and the tip 1108 (i.e. second end of the pogo pin 1100).

A length of the pogo pin 1100, measured from the tip 1108 to the base 1106, may be relatively short. Having the short length may facilitate high speeds that may be achieved by IC packages. In some embodiments, the pogo pin 1100 may have a length of less than one millimeter.

In some embodiments, the compressed state of the pogo pin 1100 may occur when the spring 1110 is compressed beyond a threshold amount of compression, the threshold amount being between the fully extended spring and the fully compressed spring (where the end 1112 contacts the base 1106). In these embodiments, the tip 1108 of the plunger 1102 may be electrically coupled to the base 1106 whenever the spring 1110 is compressed beyond the threshold amount of compression.

A second embodiment of a pogo pin 1150 may include a plunger 1152 and a body 1104. The pogo pin 1150 may include one or more of the features of the pogo pin 1100. In accordance with the embodiments of the pogo pin IC package mounts described here, a base 1156 of the body 1154 may be referred to as a first end of the pogo pin 1150 and the tip 1158 of the plunger 1152 may be referred to as a second end of the pogo pin 1150. In some embodiments, the tip 1158 may be coated with a non-corrosive material, such as non-gold, electrically conductive material including, but not limited to, a C3 coating.

A spring 1160 may be located around a circumference of the pogo pin 1100. The spring 1110 may be positioned between the base 1156 of the body 1154 and the tip 1158 of the plunger 1152, and may urge the plunger 1152 away from a base 1156 of the body 1154. When the spring 1160 is in an extended state, an end 1162 of the plunger 1152 is separated from the base 1156 of the body 1154. This state may also be referred to as a non-compressed state of the pogo pin 1150. In the non-compressed state, the plunger 1152 may be electrically isolated from the body 1154 and, accordingly, electrical signals may be prevented from transmission between the tip 1158 of the plunger 1152 and the base 1156 of the body.

As a compression force is applied to the tip 1158 of the plunger 1152 and/or the base 1156 of the body 1154 urging the tip 1158 toward the base 1156, the spring 1160 may be compressed and may allow the end 1162 of the plunger 1152 to contact the base 1156. The compression force to compress the spring may be equal to or greater than a resistance force of the spring 1160 to compression. When the spring 1160 is compressed, the pogo pin 1150 may be referred to as being in a compressed state. In the compressed state, the tip 1158 of the plunger 1152 may be electrically coupled to the base 1156 of the body 1154 and may allow transmission of electrical signals between the base 1156 (i.e. the first end of the pogo pin 1150) and the tip 1158 (i.e. second end of the pogo pin 1150).

In some embodiments, the compressed state of the pogo pin 1150 may occur when the spring 1160 compresses beyond a threshold amount of compression, the threshold amount between the fully extended spring and the fully compressed spring (where the end 1162 contacts the base 1156). In these embodiments, the tip 1158 of the plunger 1152 may be electrically coupled to the base 1156 whenever the spring 1160 is compressed beyond the threshold amount of compression.

A length of the pogo pin 1150, measured from the tip 1158 to the base 1156, may be relatively short. Having the short length may facilitate high speeds that may be achieved by IC packages. In some embodiments, the pogo pin 1150 may have a length of less than one millimeter.

While various example embodiments of pogo pins are illustrated and described herein, it is to be understood that the pogo pins that may be implemented in the pogo pin IC package mounts described herein are not limited to these embodiments and may include any embodiment of a pogo pin as understood by one having ordinary skill in the art. The pogo pins may be implemented in the plurality of pogo pins 106 (FIG. 1), the plurality of pogo pins 806 (FIG. 8), and/or the plurality of pogo pins 1006 (FIG. 10).

Figure 12:
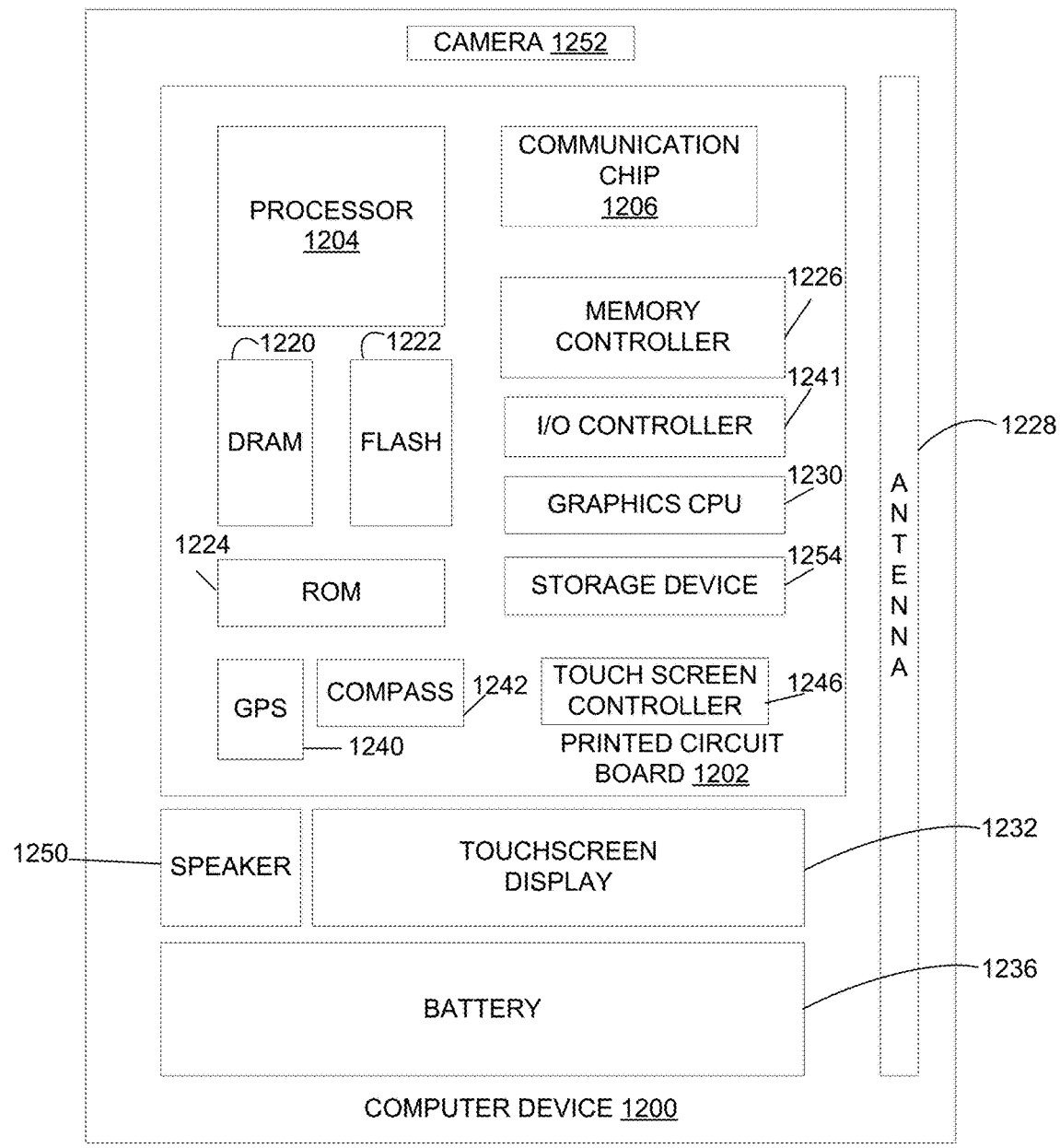
FIG. 12 illustrates an example computing device that may employ the apparatuses and/or methods described herein.

FIG. 12 illustrates an example computer device 1200 that may employ the apparatuses and/or methods described herein (e.g., the pogo pin IC package mount 100 (FIG. 1), the pogo pin IC package mount 800 (FIG. 8), and/or the pogo pin IC package mount 1000 (FIG. 10)), in accordance with various embodiments. As shown, computer device 1200 may include a number of components, such as one or more processor(s) 1204 (one shown) and at least one communication chip 1206. In various embodiments, the one or more processor(s) 1204 each may include one or more processor cores. In various embodiments, the at least one communication chip 1206 may be physically and electrically coupled to the one or more processor(s) 1204. In further implementations, the communication chip 1206 may be part of the one or more processor(s) 1204. In various embodiments, computing device 1200 may include printed circuit board (PCB) 1202. For these embodiments, the one or more processor(s) 1204 and communication chip 1206 may be disposed thereon. In alternate embodiments, the various components may be coupled without the employment of PCB 1202.

Depending on its applications, computer device 1200 may include other components that may or may not be physically and electrically coupled to the PCB 1202. These other components include, but are not limited to, memory controller 1226, volatile memory (e.g., dynamic random access memory (DRAM) 1220), non-volatile memory such as read only memory (ROM) 1224, flash memory 1222, storage device 1254 (e.g., a hard-disk drive (HDD)), an I/O controller 1241, a digital signal processor (not shown), a crypto processor (not shown), a graphics processor 1230, one or more antenna 1228, a display (not shown), a touch screen display 1232, a touch screen controller 1246, a battery 1236, an audio codec (not shown), a video codec (not shown), a global positioning system (GPS) device 1240, a compass 1242, an accelerometer (not shown), a gyroscope (not shown), a speaker 1250, a camera 1252, and a mass storage device (such as hard disk drive, a solid state drive, compact disk (CD), digital versatile disk (DVD)) (not shown), and so forth.

In some embodiments, the one or more processor(s) 1204, flash memory 1222, and/or storage device 1254 may include associated firmware (not shown) storing programming instructions configured to enable computer device 1200, in response to execution of the programming instructions by one or more processor(s) 1204, to practice all or selected aspects of the methods described herein. In various embodiments, these aspects may additionally or alternatively be implemented using hardware separate from the one or more processor(s) 1204, flash memory 1222, or storage device 1254.

In various embodiments, one or more of the pogo pin IC package mount 100 (FIG. 1), the pogo pin IC package mount 800 (FIG. 8), and/or the pogo pin IC package mount 1000 (FIG. 10) may be utilized for mounting components of the computer device 700 to the printed circuit board 702. For example, one or more of the pogo pin IC package mount 100 (FIG. 1), the pogo pin IC package mount 800 (FIG. 8), and/or the pogo pin IC package mount 1000 (FIG. 10) may be utilized for mounting the processor 704, the DRAM 720, the flash memory 722, the ROM 724, the GPS 740, the compass 742, the communication chip 706, the memory controller 726, the I/O controller 741, the graphics CPU 730, the storage device 754, the touch screen controller 746, or some combination thereof, to the printed circuit board 702.

The communication chips 1206 may enable wired and/or wireless communications for the transfer of data to and from the computer device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1200 may include a plurality of communication chips 1206. For instance, a first communication chip 1206 may be dedicated to shorter range wireless communications such as Wi-Fi and Bluetooth, and a second communication chip 1206 may be dedicated to longer range wireless communications such as GPS, EDGE, GPRS, CDMA, WiMAX, LTE, Ev-DO, and others.

In various implementations, the computer device 1200 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1200 may be any other electronic device that processes data.

Example 1 may include an apparatus to mount an integrated circuit (IC) package, comprising a printed circuit board (PCB), a plurality of pogo pins mounted to electrical contacts of the PCB, the plurality of pogo pins coupled to the electrical contacts at first ends of the plurality of pogo pins and to couple to the IC package at second ends of the plurality of pogo pins, and a mounting mechanism to position the IC package on the second ends of the plurality of pogo pins.

Example 2 may include the apparatus of example 1, wherein the mounting mechanism maintains a compression force between the IC package and the PCB, the compression force sufficient to compress the plurality of pogo pins.

Example 3 may include the apparatus of any of the examples 1 and 2, wherein the mounting mechanism includes one or more surface-mount (SMT) fixtures mounted to the PCB, a mounting plate to position the IC package on the second ends of the plurality of pogo pins, and one or more mounting extensions to affix the mounting plate to the one or SMT fixtures.

Example 4 may include the apparatus of example 3, wherein the one or more mounting extensions are one or more screws, and wherein the one or more SMT fixtures each have a threaded aperture to receive the one or more screws.

Example 5 may include the apparatus of example 3, wherein the mounting plate has a recess formed in a side of the mounting plate, and wherein the recess is to receive the IC package and maintain a position of the IC package relative to the mounting plate.

Example 6 may include the apparatus of any of the examples 1 and 2, wherein the mounting mechanism includes a mounting plate to position the IC package on the second ends of the plurality of pogo pins, a back plate positioned on an opposite side of the PCB from the mounting plate, and one or more mounting extensions to affix the mounting plate to the back plate and maintain a distance between the mounting plate and the back plate.

Example 7 may include the apparatus of example 6, wherein the mounting plate has a recess formed in a side of the mounting plate, and wherein the recess is to receive the IC package and maintain a position of the IC package relative to the mounting plate.

Example 8 may include the apparatus of any of the examples 1 and 2, wherein the IC package includes a ball grid array (BGA), and wherein solder balls of the BGA are positioned on the second ends of the plurality of pogo pins by the mounting mechanism.

Example 9 may include the apparatus of any of the examples 1 and 2, wherein the second ends of the plurality of pogo pins are coated with a non-corrosive material.

Example 10 may include the apparatus of example 9, wherein the non-corrosive material is a non-gold, electrically conductive material.

Example 11 may include the apparatus of any of the examples 1 and 2, wherein the IC package includes a ball grid array (BGA), and the apparatus further comprises a land grid array (LGA) interposer to electrically couple the IC package to the plurality of pogo pins, the LGA interposer positioned between the IC package and the plurality of pogo pins, wherein electrical contacts of the IC package are coupled to a first set of electrical contacts on a first side of the LGA interposer via the BGA, and wherein a second set of electrical contacts on a second side of the LGA, opposite the first side, is coupled to the second ends of the plurality of pogo pins.

Example 12 may include a computer system, comprising a printed circuit board (PCB), a plurality of pogo pins mounted to the PCB, first ends of the plurality of pogo pins coupled to electrical contacts of the PCB, an integrated circuit (IC) package positioned on the plurality of pogo pins, electrical contacts of the IC package coupled to second ends of the plurality of pogo pins, and a mounting mechanism to mount the IC package to the PCB with the plurality of pogo pins located between the IC package and the PCB, the mounting mechanism to compress the plurality of pogo pins between the IC package and the PCB.

Example 13 may include the computer system of example 12, wherein the mounting mechanism includes one or more surface mount (SMT) fixtures affixed to the PCB, a mounting plate to position the IC package on the plurality of pogo pins, and one or more mounting extensions that extend between the one or more SMT fixtures and the mounting plate, the one or more mounting extensions to maintain a position of the mounting plate.

Example 14 may include the computer system of example 13, wherein the one or more mounting extensions include one or more screws, and wherein the one or more SMT fixtures each include a threaded aperture to receive the one or more screws.

Example 15 may include the computer system of example 13, wherein the mounting plate has a recess formed in a side of the mounting plate located toward the PCB, wherein the IC package resides, at least partially, within the recess.

Example 16 may include the computer system of any of the examples 12-15, wherein the mounting mechanism includes a back plate positioned on a side of the PCB opposite from the IC package, a mounting plate positioned on a side of the IC package opposite from the PCB, and one or more mounting extensions to affix the mounting plate to the back plate and maintain a distance between the back plate and the mounting plate.

Example 17 may include the computer system of example 16, wherein the mounting plate has a recess formed in a side of the mounting plate located toward the PCB, wherein the IC package resides, at least partially, within the recess.

Example 18 may include the computer system of example 16, wherein the one or more mounting extensions extend through one or more apertures formed in the in the PCB.

Example 19 may include the computer system of any of the examples 12 and 13, wherein the IC package includes a ball grid array (BGA), wherein the electrical contacts of the IC package are coupled to the second ends of the plurality of pogo pins via the BGA.

Example 20 may include the computer system of any of the examples 12-15, wherein the IC package includes a semiconductor package with a ball grid array (BGA) on a side of the semiconductor package, and a land grid array (LGA) interposer located on the side of the semiconductor package, the LGA interposer coupled, on a first side of the LGA interposer, to the semiconductor package by the BGA and coupled, on a second side of the LGA interposer opposite the first side, to the plurality of pogo pins, wherein the LGA interposer is to convey signals between the semiconductor package and the plurality of pogo pins.

Example 21 may include the computer system of any of the examples 12-15, wherein the second ends of the plurality of pogo pins are coated with a non-corrosive material.

Example 22 may include the computer system of example 21, wherein the non-corrosive material is a non-gold, electrically conductive material.

Example 23 may include a method of coupling an integrated circuit (IC) package to a printed circuit board (PCB), comprising coupling first ends of a plurality of pogo pins to electrical contacts of the PCB, positioning the IC package with electrical contacts of the IC package aligned with second ends of the plurality of pogo pins, applying a compression force to one or both of the PCB and the IC package, the compression force compressing the plurality of pogo pins between the electrical contacts of the PCB and the electrical contacts of the IC package.

Example 24 may include the method of example 23, wherein coupling the first ends of the plurality of pogo pins to the electrical contacts of the PCB includes soldering the first ends of the plurality of pogo pins to the electrical contacts of the PCB.

Example 25 may include the method of any of the examples 23 and 24, wherein coupling the first ends of the plurality of pogo pins to the electrical contacts of the PCB includes positioning, using a carrier body, the first ends of the plurality of pogo pins on the electrical contacts of the PCB, soldering the first ends of the plurality of pogo pins to the electrical contacts of the PCB while the plurality of pogo pins are located within the carrier body, and removing the carrier body from the pogo pins after soldering the first ends of the plurality of pogo pins to the electrical contacts of the PCB.

Example 26 may include the method of any of the examples 23 and 24, wherein positioning the IC package includes positioning the IC package in a cavity of a mounting plate of a mounting mechanism, wherein the mounting mechanism aligns the electrical contacts of the IC package with the second ends of the pogo pins, and wherein the mounting mechanism applies the compression force.

Example 27 may include the method of example 26, further comprising affixing one or more surface-mount (SMT) fixtures to a surface of the PCB, and attaching the mounting plate to the one or more SMT fixtures via one or more mounting extensions of the mounting mechanism.

Example 28 may include the method of example 27, wherein the one or more mounting extensions include one or more screws, wherein the one or more SMT fixtures each include a threaded aperture, and wherein attaching the mounting plate to the one or more SMT fixtures includes screwing the one or more screws at least partially into the threaded aperture of a corresponding SMT fixture of the one or more SMT fixtures.

Example 29 may include the method of example 26, further comprising positioning a back plate on a first side of the PCB, aligning the mounting plate with the back plate on a second side of the PCB, the second side opposite the first side, and affixing the mounting plate to the plate via one or more mounting extensions, the one or more mounting extensions passing through apertures formed in the PCB.

Example 30 may include the method of any of the examples 23 and 24, further comprising determining an amount of force to compress the plurality of pogo pins based on a number of the plurality of pogo pins, wherein applying the compression force includes applying an amount of the compression force equal to or greater than the amount of force to compress the plurality of pogo pins.

Example 31 may include the method of any of the examples 23 and 24, wherein the IC package includes a ball grid array (BGA), and wherein positioning the IC package includes aligning solder balls of the BGA with the second ends of the plurality of pogo pins.

Example 32 may include the method of any of the examples 23 and 24, wherein the IC package includes a semiconductor package with a ball grid array (BGA) and a land grid array (LGA) interposer coupled to the semiconductor package, on a first side of the LGA interposed via the BGA, wherein the electrical contacts of the IC package are located on a second side of the LGA interposer and are electrically coupled to the BGA.

Example 33 may include the method of any of the examples 23 and 24, further comprising applying a non-corrosive coating to the second ends of the plurality of pogo pins.

Example 34 may include the method of example 33, wherein the non-corrosive coating is a non-gold, conductive material coating.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An apparatus to mount an integrated circuit (IC) package, comprising:
   a printed circuit board (PCB);
   a plurality of pogo pins mounted to electrical contacts of the PCB, the plurality of pogo pins coupled to the electrical contacts at first ends of the plurality of pogo pins and to couple to the IC package at second ends of the plurality of pogo pins; and
   a mounting mechanism to position the IC package on the second ends of the plurality of pogo pins and, wherein the mounting mechanism includes:
   a mounting plate to position the IC package on the second ends of the plurality of pogo pins and to maintain a compression force between the IC package and the PCB; and
   one or more mounting extensions to couple the mounting plate to the PCB, wherein the one or more mounting extensions are to maintain a distance between the mounting plate and the PCB, and wherein the distance is selected to cause the compression force.

2. The apparatus of claim 1, wherein the compression force is sufficient to compress the plurality of pogo pins.

3. The apparatus of claim 1, wherein the mounting mechanism includes:
   one or more surface-mount (SMT) fixtures mounted to the PCB, wherein the one or more mounting extensions are to be affixed to the one or more SMT fixtures to couple the mounting plate to the PCB.

4. The apparatus of claim 3, wherein the one or more mounting extensions are one or more screws, and wherein the one or more SMT fixtures each have a threaded aperture to receive one of the one or more screws.

5. The apparatus of claim 3, wherein the mounting plate has a recess formed in a side of the mounting plate, and wherein the recess is to receive the IC package and maintain a position of the IC package relative to the mounting plate.

6. The apparatus of claim 1, wherein the mounting mechanism includes:
   a back plate positioned on an opposite side of the PCB from the mounting plate, wherein the one or more mounting extensions are to be affixed to the back plate to couple the mounting plate to the PCB.

7. The apparatus of claim 6, wherein the mounting plate has a recess formed in a side of the mounting plate, and wherein the recess is to receive the IC package and maintain a position of the IC package relative to the mounting plate.

8. The apparatus of claim 1, wherein the IC package includes a ball grid array (BGA), and wherein solder balls of the BGA are positioned on the second ends of the plurality of pogo pins by the mounting mechanism.

9. The apparatus of claim 1, wherein the second ends of the plurality of pogo pins are coated with a non-corrosive material.

10. The apparatus of claim 9, wherein the non-corrosive material is a non-gold, electrically conductive material.

11. The apparatus of claim 1, wherein:
    the IC package includes a ball grid array (BGA); and
    the apparatus further comprises a land grid array (LGA) interposer to electrically couple the IC package to the plurality of pogo pins, the LGA interposer positioned between the IC package and the plurality of pogo pins, wherein electrical contacts of the IC package are coupled to a first set of electrical contacts on a first side of the LGA interposer via the BGA, and wherein a second set of electrical contacts on a second side of the LGA, opposite the first side, is coupled to the second ends of the plurality of pogo pins.

12. A computer system, comprising:
    a printed circuit board (PCB);
    a plurality of pogo pins mounted to the PCB, first ends of the plurality of pogo pins coupled to electrical contacts of the PCB;
    an integrated circuit (IC) package positioned on the plurality of pogo pins, electrical contacts of the IC package coupled to second ends of the plurality of pogo pins; and
    a mounting mechanism that mounts the IC package to the PCB with the plurality of pogo pins located between the IC package and the PCB, wherein the mounting mechanism compresses the plurality of pogo pins between the IC package and the PCB, and wherein the mounting mechanism includes:
    a mounting plate to position the IC package on the plurality of pogo pins and maintain compression between the IC package and the PCB, wherein the IC package is located between the mounting plate and the PCB; and
    one or more mounting extensions that couple the mounting plate to the PCB and maintain a position of the mounting plate, wherein the position of the mounting plate causes the compression between the IC package and the PCB.

13. The computer system of claim 12, wherein the mounting mechanism includes:
    one or more surface mount (SMT) fixtures affixed to the PCB, wherein the mounting extensions extend between the one or more SMT fixtures and the mounting plate.

14. The computer system of claim 13, wherein the one or more mounting extensions include one or more screws, and wherein the one or more SMT fixtures each include a threaded aperture that receives one of the one or more screws.

15. The computer system of claim 13, wherein the mounting plate has a recess formed in a side of the mounting plate located toward the PCB, wherein the IC package resides, at least partially, within the recess.

16. The computer system of claim 12, wherein the mounting mechanism includes:

a back plate positioned on a side of the PCB opposite from the IC package, wherein the one or more mounting extensions affix the mounting plate to the back plate.

17. The computer system of claim 16, wherein the mounting plate has a recess formed in a side of the mounting plate located toward the PCB, wherein the IC package resides, at least partially, within the recess.

18. The computer system of claim 16, wherein the one or more mounting extensions extend through one or more apertures formed in the PCB.

19. The computer system of claim 12, wherein the IC package includes a ball grid array (BGA), wherein the electrical contacts of the IC package are coupled to the second ends of the plurality of pogo pins via the BGA.

20. The computer system of claim 12, wherein the IC package includes:

a semiconductor package with a ball grid array (BGA) on a side of the semiconductor package; and a land grid array (LGA) interposer located on the side of the semiconductor package, the LGA interposer coupled, on a first side of the LGA interposer, to the semiconductor package by the BGA and coupled, on a second side of the LGA interposer opposite the first side, to the plurality of pogo pins, wherein the LGA interposer is to convey signals between the semiconductor package and the plurality of pogo pins.

* * * * *